US012696766B2

(12) United States Patent
Peng et al.

(10) Patent No.: US 12,696,766 B2
(45) Date of Patent: Jul. 28, 2026

(54) SYSTEM-IN-PACKAGE MODULE AND METHOD FOR MANUFACTURING THE SAME

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Man-Zhi Peng, Huaian (CN); Ming-Jaan Ho, New Taipei (TW); Xian-Min Du, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 360 days.

(21) Appl. No.: 18/233,909

(22) Filed: Aug. 15, 2023

(65) Prior Publication Data

US 2024/0203899 A1     Jun. 20, 2024

Related U.S. Application Data

(63) Continuation-in-part of application No. PCT/CN2022/139349, filed on Dec. 15, 2022.

(51) Int. Cl.
H10W 42/20     (2026.01)
H10W 74/10     (2026.01)
H10W 90/00     (2026.01)

(52) U.S. Cl.
CPC .......... H10W 42/20 (2026.01); H10W 74/114 (2026.01); H10W 90/00 (2026.01)

(58) Field of Classification Search
CPC ............................. H01L 23/552; H10W 42/20
See application file for complete search history.

(56) References Cited

U.S. PATENT DOCUMENTS

2010/0195291 A1*   8/2010   Kimura ................ H05K 1/0218
                                                                  361/748
2010/0316875 A1*  12/2010   Lamon ................... C08G 59/50
                                                                  524/437

(Continued)

FOREIGN PATENT DOCUMENTS

CN        109378276 A   *   2/2019
JP        2018064054 A   *   4/2018

(Continued)

*Primary Examiner* — Zandra V Smith
*Assistant Examiner* — Krishna J Palaniswamy
(74) *Attorney, Agent, or Firm* — ScienBiziP, P.C.

(57)          ABSTRACT
A method for manufacturing a system-in-package module includes providing a carrier plate; mounting a plurality of electronic components on the carrier plate, wherein the plurality of electronic components are electrically connected to the carrier plate; providing a plastic encapsulation film which comprises a resin and an inorganic filler; providing an electromagnetic shielding film; pressing the electromagnetic shielding film and the plastic encapsulation film into a composite structure; and pressing the composite structure onto the carrier plate, wherein the plastic encapsulation film is in contact with and covers a surface of the carrier plate and encapsulates the plurality of electronic components. A system-in-package module is also disclosed.

15 Claims, 10 Drawing Sheets

(56) References Cited

U.S. PATENT DOCUMENTS

2011/0115066 A1 * 5/2011 Kim .................... H10W 74/117
257/690
2016/0133579 A1    5/2016 Akiba et al.

FOREIGN PATENT DOCUMENTS

WO    WO-2007116979 A1 * 10/2007 ............ H10W 74/10
WO    WO-2010132049 A1 * 11/2010 ........... H05K 9/0084

* cited by examiner

101

102
11
102

SYSTEM-IN-PACKAGE MODULE AND METHOD FOR MANUFACTURING THE SAME

FIELD

The subject matter herein generally relates to the field of semiconductor manufacture, in particular, to a system-in-package module and a method for manufacturing a system-in-package module.

BACKGROUND

A system-in-package (SiP) may include a plurality of circuit (IC) chips and/or other circuit components in one semiconductor package to implement one system. Such package typically includes an epoxy molding compound (EMC) that encapsulates the IC chips and other circuit components and an electromagnetic interference (EMI) shield for reducing EMI emission from the package. The EMC is generally formed to encapsulate the IC chips and other components by using a compress molding process or a transfer molding that requires professional molding equipment which is expensive.

BRIEF DESCRIPTION OF THE DRAWINGS

Implementations of the present technology will now be described, by way of embodiment, with reference to the attached figures.

DETAILED DESCRIPTION

Figure 1:
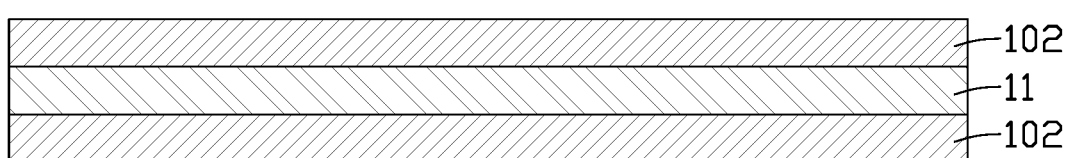
FIG. 1 is a cross-sectional view of an embodiment of a substrate according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "connected" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Referring to FIGS. 1 to 12, a method for manufacturing a system-in-package module 100 is illustrate. The method includes steps as follows.

Figure 2:
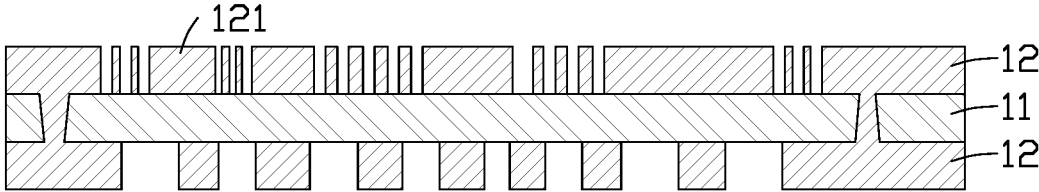
FIG. 2 is a cross-sectional view showing a circuit layer formed from the substrate of FIG. 1.
Figure 3:
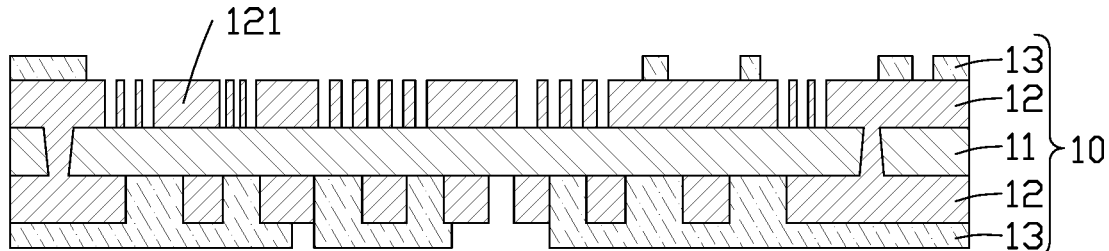
FIG. 3 is a cross-sectional view of an embodiment of a carrier plate according to the present disclosure.

Step S1, referring to FIGS. 1-3, a carrier plate 10 is provided. The carrier plate 10 includes an insulation layer 11, a circuit layer 12, and a protective layer 13. The circuit layer 12 is disposed on a surface of the insulation layer 11, and the protective layer 13 is disposed on a surface of the circuit layer 12 facing away from the insulation layer 11. The circuit layer 12 includes a plurality of connecting pads 121 which are exposed from the protective layer 13.

In the embodiment, the number of the insulation layer 11 is one, and the number of the circuit layer 12 and the protective layer 13 are both two. The two circuit layers 12 are disposed on opposite surfaces of the insulation layer 11, and each of the two protective layer 13 is disposed on a surface of a corresponding one of the two circuit layers 12 facing away from the insulation layer 11. In other embodiments, the number of the insulation layer 11 may be more than one, the number of the circuit layer 12 may be one or more than two, and the number of the protective layer 13 is the same as the number of the circuit layer 12 outside the carrier plate 10.

The insulation layer 11 can be made of liquid crystal polymer (LCP), polytetrafluoroethylene (PTFE), Polyether ether ketone (PEEK), polyphenylene oxide (PPO), polyimide (PI), polyethylene terephthalate (PET), polyethylene naphthalate (PEN), polyethylene (PE), etc.

The protective layer 13 may be a cover layer (CVL) or a solder mask for protecting the circuit layer 12.

Specifically, the carrier plate 10 is provided by steps as follows.

Step S11, referring to FIG. 1, a substrate 101 is provided. The substrate 101 includes the insulation layer 11 and two metal layers 102.

The material of the metal layers 102 may be gold, silver, copper, etc. In the embodiment, the material of the metal layer 102 is copper.

Step S12, referring to FIG. 2, the metal layer 102 is processed to form the circuit layer 12. It can be understood that other known circuit production methods can be used to form the circuit layer 12 on the insulation layer 11.

Step S13, the protective layer 13 is formed on the surface of the circuit layer 12 facing away from the insulation layer 11, thereby obtaining the carrier plate 10. The connecting pads 121 are exposed from the protective layer 13.

When the protective layer 13 is a cover layer, the cover layer is attached to the surface of the circuit layer 12 by bonding. When the protective layer 13 is a solder mask, the solder mask is formed on the surface of the circuit layer 12 by printing of solder mask ink.

Figure 4:
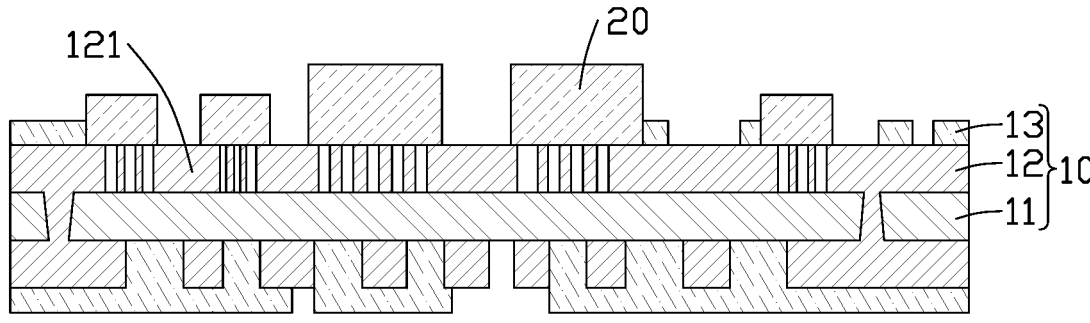
FIG. 4 is a cross-sectional view showing a plurality of electronic components mounted on the carrier plate of FIG. 3.

Step S2, referring to FIG. 4, a plurality of electronic components 20 are mounted on the connecting pads 121. The electronic components 20 are electrically connected to the carrier plate 10.

The electronic components 20 includes an active component and/or a passive component. The number of the active component and passive component is not limited and can be one or more.

The electronic components 20 may be mounted on the connecting pads 121 by surface mounting technology.

Figure 5:
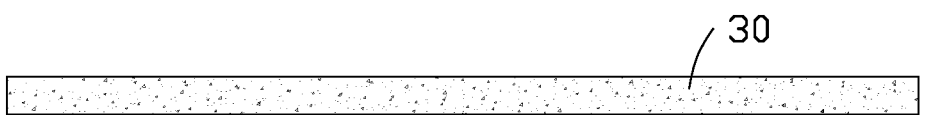
FIG. 5 is a cross-sectional view of an embodiment of a plastic encapsulation film according to the present disclosure.

Step S3, referring to FIG. 5, a plastic encapsulation film 30 is provided.

The plastic encapsulation film 30 has an elongation at break that is in a range of 60% to 150%, so that the plastic encapsulation film 30 will not be ruptured by the electronic components 20 during the subsequent pressing process. The plastic encapsulation film 30 also has a water absorption rate of less than 0.5%, and a thickness in a range of 50 μm to 500 μm.

The plastic encapsulation film 30 includes a resin with a mass percentage of 50% to 80% and an inorganic filler with a mass percentage of 10% to 30%. The resin includes epoxy resin, ethyl acrylate, amino ethyl formate, or other resin materials with high ductility. The inorganic filler includes silica, alumina, hydrated alumina, titanium oxide, magnesium oxide, magnesium hydroxide, alumina doped silica, boehmite, or other known inorganic fillers. The plastic encapsulation film 30 may also include, but is not limited, conventional additives, such as hardeners, catalysts, flame retardants, coupling agents, release agents, etc.

Figure 6:
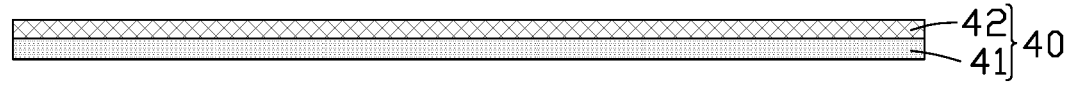
FIG. 6 is a cross-sectional view of an embodiment of an electromagnetic shielding film according to the present disclosure.

Step S4, referring to FIG. 6, an electromagnetic shielding film 40 is provided, and the electromagnetic shielding film 40 is processed into a predetermined shape, such that the electromagnetic shielding film 40 can shield a predetermined area of the carrier plate 10.

The electromagnetic shielding film 40 includes an electromagnetic shielding layer 41 and a release film 42 stacked on the electromagnetic shielding layer 41. The electromagnetic shielding layer 41 includes metal materials. In the embodiment, the electromagnetic shielding layer 41 is a conductive fabric. In other embodiments, the electromagnetic shielding layer 41 is a metal layer.

The electromagnetic shielding film 40 can be processed by punching to have the predetermined shape. The electromagnetic shielding film 40 with the preset shape only shields the parts of an element that need to be shielded, achieving regional shielding. When the electromagnetic shielding film 40 with the preset shape is used, a part of the element that needs to be shielded is equipped with the electromagnetic shielding film 40, and the other part of the element that does not need to be shielded is exposed from the electromagnetic shielding film 40. When the entire element needs to be shielded, the electromagnetic shielding film 40 does not need to be processed, and the shape of the electromagnetic shielding film 40 is the same as the shape of the plastic encapsulation film 30.

Figure 7:
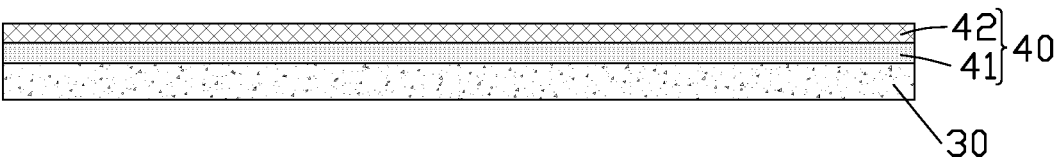
FIG. 7 is a cross-sectional view showing that the plastic encapsulation film of FIG. 5 and the electromagnetic shielding film of FIG. 6 are pressed together.

Step S5, referring to FIG. 7, the electromagnetic shielding film 40 and the plastic encapsulation film 30 are pre-pressed into a composite structure. The electromagnetic shielding film 40 is laminated on and fits with the plastic encapsulation film 30 to form the composite structure.

During pressing, the plastic encapsulation film 30 is heated and thus is melt, such that the plastic encapsulation film 30 can tightly fit with the electromagnetic shielding layer 41 to form the composite structure.

Figure 8:
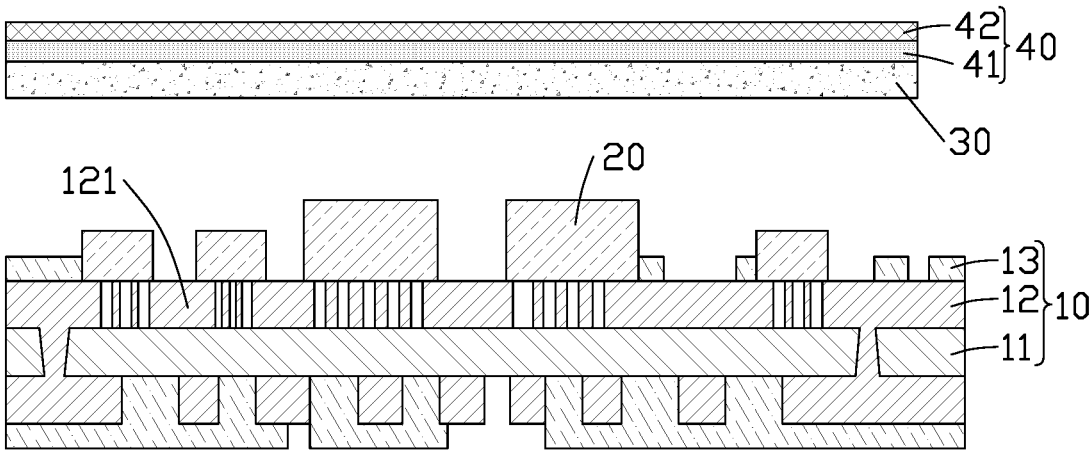
FIG. 8 is a cross-sectional view showing the plastic encapsulation film of FIG. 7 above the carrier plate of FIG. 4.
Figure 9:
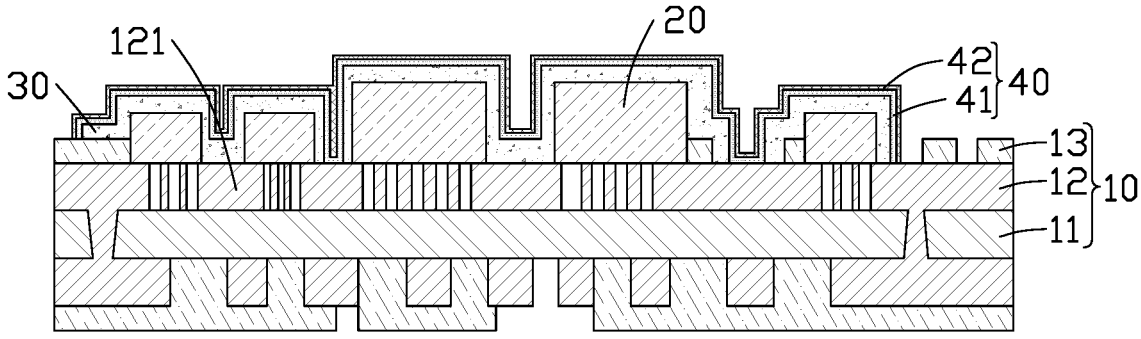
FIG. 9 is a cross-sectional view showing a state in which the plastic encapsulation film of FIG. 8 is pressed onto the carrier plate of FIG. 8.

Step S6, referring to FIGS. 8 and 9, the composite structure formed from the plastic encapsulation film 30 and the electromagnetic shielding film 40 is pressed onto the carrier plate 10, the plastic encapsulation film 30 is in contact with and covers a surface of the carrier plate 10 and encapsulates the electronic components 20.

If the electromagnetic shielding film 40 is processed into a predetermined shape, a portion of the surface of the carrier plate 10 exposed from the electronic components 20 is exposed from the electromagnetic shielding film 40 after the composite structure is pressed onto the carrier plate 10. In other embodiments, part of the surface of the carrier plate 10 exposed from the electronic components 20 is also covered by the electromagnetic shielding film 40 after the composite structure is pressed onto the carrier plate 10. That is, the electromagnetic shielding film 40 covers an entirety of the plastic encapsulation film 30 and an entirety of the carrier plate 10.

The composite structure is pressed onto the carrier plate 10 by using a conventional vacuum pressing process in a manufacturing process of a circuit board. Compared to the compress molding process or transfer molding process, there is no need for professional molding equipment, thereby reducing costs.

Figure 10:
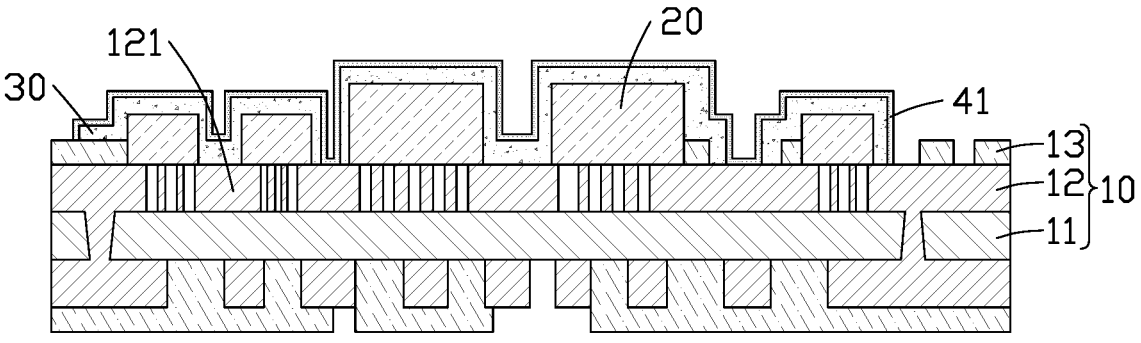
FIG. 10 is a cross-sectional view showing a state in which a release film of the electromagnetic shielding film of FIG. 9 is removed.

Step S7, referring to FIGS. 9 and 10, the release film 42 is removed by peeling.

Figure 11:
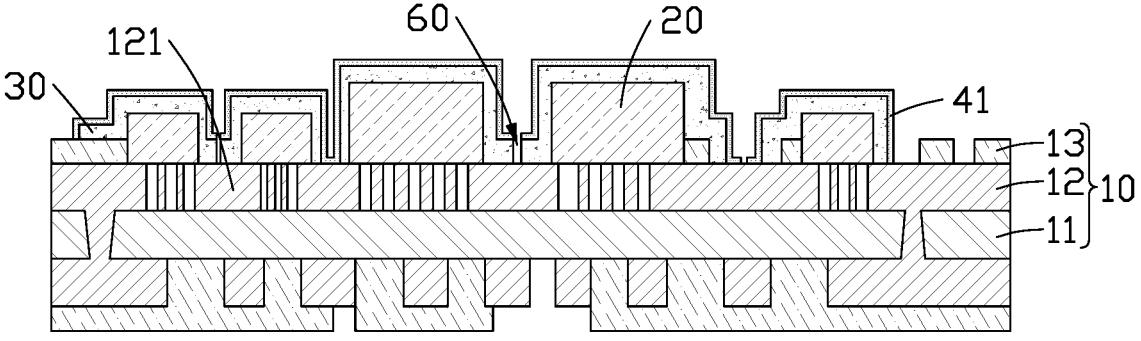
FIG. 11 is a cross-sectional view showing ground holes formed in a structure shown in FIG. 10.

Step S8, referring to FIG. 11, a ground hole 60 is formed, the ground hole 60 penetrating the electromagnetic shielding layer 41 and the plastic encapsulation film 30 and exposing a portion of the circuit layer 12.

The ground hole 60 may be formed by mechanical drilling or laser drilling. The ground hole 60 can be, but is not limited to, round, rectangular, prismatic, ring-shaped, etc.

Figure 12:
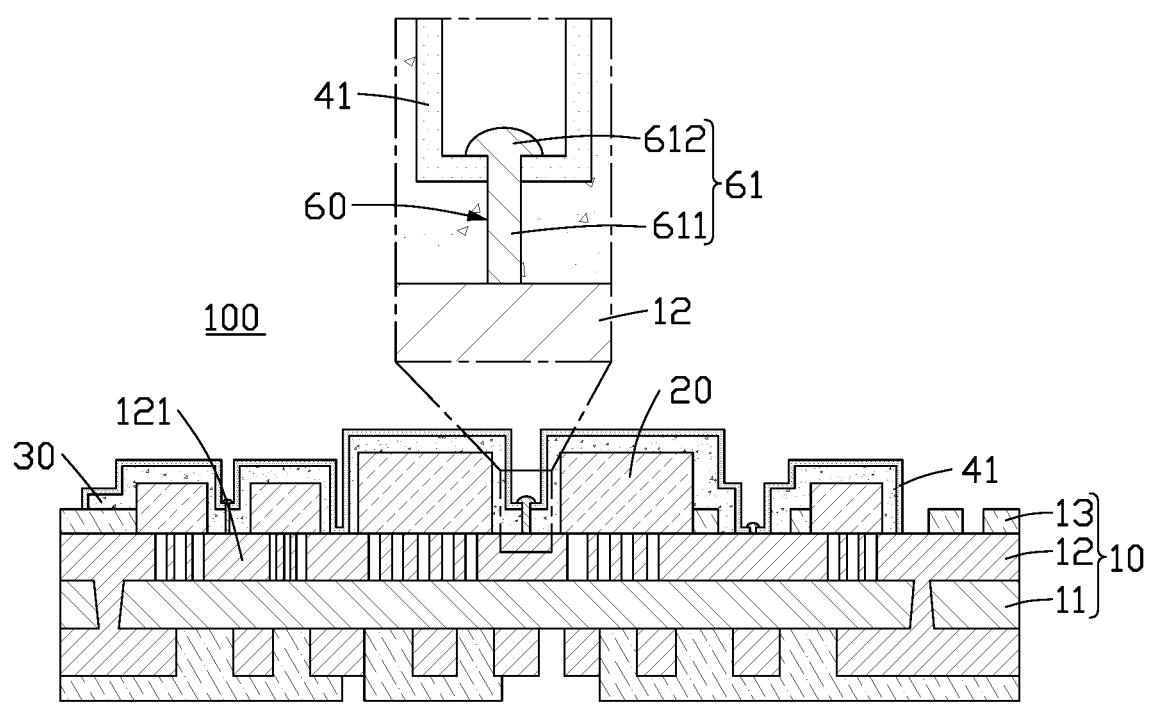
FIG. 12 is a cross-sectional view of an embodiment of a system-in-package module according to the present disclosure.

Step S9, referring to FIG. 12, conductive paste 61 is infilled into the ground hole 60, obtaining the system-in-package module 100. The conductive paste 61 is connected to the circuit layer 12 and the electromagnetic shielding layer 41, thereby achieving a grounding role function.

The conductive paste 61 includes a pillar 611 and a cap 612. The pillar 611 is infilled into the ground hole 60 and electrically connected to circuit layer 12. The cap 612 covers a portion of the electromagnetic shielding layer 41 located around the ground hole 60 and is electrically connected to the electromagnetic shielding layer 41.

In one embodiment, the conductive paste 60 is infilled into the ground hole 60 by a glue dispensing process. In the glue dispensing process, a cap 612 is naturally formed at one end of the pillar 611 by using the fluidity of conductive paste, improving firmness of the conductive glue 61.

The conductive paste 61 has a viscosity of less than 6000 cps, which helps to fill the ground hole 60 with the conductive paste 61 by the glue dispensing process. The conductive paste 61 may be, but is not limited to, copper paste or silver paste.

Referring to FIG. 12, the system-in-package module 100 includes the carrier plate 10, the plurality of electronic components 20, and the composite structure. The electronic components 20 are disposed on a surface of the carrier plate 10 and are electrically connected to the carrier plate 10. The composite structure includes the plastic encapsulation film 30 and the electromagnetic shielding layer 41 laminated on the plastic encapsulation film 30. The plastic encapsulation film 30 is in contact with and covers the surface of the carrier plate 10 with the electronic components 20 and encapsulates the electronic components 20. The electromagnetic shielding layer 41 is disposed on the surface of the plastic encapsulation film 30 facing away from the carrier plate 10.

The carrier plate 10 includes the insulation layer 11, the circuit layer 12, and the protective layer 13. The circuit layer 12 is disposed on a surface of the insulation layer 11, and the protective layer 13 is disposed on the surface of the circuit layer 12 facing away from the insulation layer 11. The circuit layer 12 includes the plurality of connecting pads 121 which are exposed from the protective layer 13. The plurality of electronic components 20 is soldered on the plurality of connecting pads 121.

The plastic encapsulation film 30 has an elongation at break in a range of 60% to 150%, a water absorption rate of less than 0.5%, and a thickness in a range of 50 μm to 500 μm.

The plastic encapsulation film 30 includes the resin with a mass percentage of 50% to 80% and the inorganic filler with a mass percentage of 10% to 30%. The plastic encapsulation film 30 may also include, but is not limited, conventional additives, such as hardeners, catalysts, flame retardants, coupling agents, release agents, etc.

The electromagnetic shielding layer 41 defines the ground hole 60, and the ground hole 60 extends through the plastic encapsulation film 30. The ground hole 60 is infilled with conductive paste 61. The conductive paste 61 is connected to the circuit layer 12 and the electromagnetic shielding layer 41, thereby achieving a grounding role function.

In the method for manufacturing the system-in-package module 100, the plastic encapsulation film 30 is pressed onto the carrier plate 10 to encapsulate the electronic components 20, there is no need for professional molding equipment, thereby reducing costs. In addition, the electromagnetic shielding film 40/electromagnetic shielding layer is pressed onto the carrier plate 10 to achieve a function of electromagnetic shielding. Before pressing, the electromagnetic shielding film 40 can be processed to obtain a preset shape for regional shielding, making the process simple and easy.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A method for manufacturing a system-in-package module, comprising:
   providing a carrier plate;
   mounting a plurality of electronic components on the carrier plate, wherein the plurality of electronic components is electrically connected to the carrier plate;
   providing a plastic encapsulation film which comprises a resin and an inorganic filler;

providing an electromagnetic shielding film;
pressing the electromagnetic shielding film and the plastic encapsulation film into a composite structure;
pressing the composite structure onto the carrier plate, wherein the plastic encapsulation film is in contact with and covers a surface of the carrier plate and encapsulates the plurality of electronic components;
forming a ground hole penetrating the electromagnetic shielding film and the plastic encapsulation film; and
infilling the ground hole with a conductive paste by glue dispending process, wherein the conductive paste is connected to the electromagnetic shielding film and the carrier plate, the conductive paste comprises a pillar and a cap, the pillar is infilled into the ground hole and electrically connected to the carrier plate, and the cap covers a portion of the electromagnetic shielding layer around the ground hole and is electrically connected to the electromagnetic shielding layer.

2. The method of claim 1, before pressing the composite structure onto the carrier plate, the method further comprises processing the electromagnetic shielding film into a predetermined shape; and the composite structure is pressed onto the carrier plate such that a portion of a surface of the carrier plate exposed from the plurality of electronic components is exposed from the electromagnetic shielding film.

3. The method of claim 1, wherein the electromagnetic shielding film is provided such that the electromagnetic shielding film covers an entirety of the plastic encapsulation film.

4. The method of claim 1, wherein the electromagnetic shielding film is provided with an electromagnetic shielding layer and a release film disposed on the electromagnetic shielding layer, the electromagnetic shielding film is pressed onto the plastic encapsulation film such that the electromagnetic shielding layer is in contact with the plastic encapsulation film; and before forming the ground hole, the method further comprises removing the release film.

5. The method of claim 1, wherein providing the carrier plate comprises:
   providing a substrate which comprises an insulation layer and a metal layer;
   processing the metal layer to form a circuit layer, wherein the circuit layer comprises a plurality of connecting pads configured for mounting the plurality of electronic components; and
   forming a protective layer on a surface of the circuit layer, wherein the plurality of connecting pads is exposed from the protective layer.

6. The method of claim 1, wherein the plastic encapsulation film has an elongation at break in a range of 60% to 150%.

7. The method of claim 1, wherein the plastic encapsulation film has a water absorption rate of less than 0.5%.

8. The method of claim 1, wherein the plastic encapsulation film has a thickness in a range of 50 μm to 500 μm.

9. A system-in-package module comprising:
   a carrier plate;
   a plurality of electronic components mounted on the carrier plate;
   a plastic encapsulation film comprising a resin and an inorganic filler, wherein the plastic encapsulation film covers a surface of the carrier plate and encapsulates the plurality of electronic components;
   an electromagnetic shielding layer disposed on a surface of the plastic encapsulation film facing away from the carrier plate;

a ground hole penetrating the electromagnetic shielding layer and the plastic encapsulation film; and a conductive paste infilling the ground hole, wherein the conductive paste comprises a pillar and a cap, the pillar is infilled into the ground hole and electrically connected to the carrier plate, the cap covers a portion of the electromagnetic shielding layer around the ground hole and is electrically connected to the electromagnetic shielding layer.

10. The system-in-package module of claim 9, wherein the electromagnetic shielding layer has a predetermined shape, a portion of a surface of the carrier plate exposed from the plurality of electronic components is exposed from the electromagnetic shielding layer.

11. The system-in-package module of claim 9, wherein the electromagnetic shielding layer covers an entirety of the plastic encapsulation film.

12. The system-in-package module of claim 9, wherein the carrier plate comprises an insulation layer, a circuit layer disposed on a surface of the insulation layer, and a protective layer disposed on a surface of the circuit layer, the circuit layer comprises a plurality of connecting pads for mounting the plurality of electronic components, and the plurality of connecting pads are exposed from the protective layer.

13. The system-in-package module of claim 9, wherein the plastic encapsulation film has an elongation at break in a range of 60% to 150%.

14. The system-in-package module of claim 9, wherein the plastic encapsulation film has a water absorption rate of less than 0.5%.

15. The system-in-package module of claim 9, wherein the plastic encapsulation film has a thickness in a range of 50 μm to 500 μm.

\* \* \* \* \*